United States Patent
Saito et al.

[11] Patent Number: 5,871,609
[45] Date of Patent: Feb. 16, 1999

[54] ELECTRODE PLATE AND JIG FOR USE IN PLASMA ETCHING

[75] Inventors: Kazuo Saito; Takeshi Ishimatsu, both of Tokyo, Japan

[73] Assignee: Nisshinbo Industries, Inc, Tokyo, Japan

[21] Appl. No.: 71,399

[22] Filed: Jun. 4, 1993

[30] Foreign Application Priority Data

Jun. 12, 1992 [JP] Japan .................................. 4-179256
Jun. 12, 1992 [JP] Japan .................................. 4-179257

[51] Int. Cl.$^6$ .................................. C23F 1/02; H01B 1/04
[52] U.S. Cl. ................ 156/345; 204/298.31; 252/502; 252/510; 252/511; 423/445 R
[58] Field of Search .................. 156/345; 204/298.31, 204/298.39, 294; 423/445 R, 447.2, 447.4, 449.6; 252/502, 510, 511

[56] References Cited

U.S. PATENT DOCUMENTS

| | | | |
|---|---|---|---|
| 2,941,966 | 6/1960 | Campbell et al. ...................... | 521/108 |
| 5,074,456 | 12/1991 | Degner et al. .......................... | 156/345 |
| 5,093,214 | 3/1992 | Saito et al. ........................... | 423/447.2 |

FOREIGN PATENT DOCUMENTS 3-285086  12/1991  Japan .

*Primary Examiner*—M. Nuzolillo
*Assistant Examiner*—Rodney G. McDonald
*Attorney, Agent, or Firm*—Kubovcik & Kubovcik

[57] ABSTRACT

An electrode plate for use in plasma etching, which includes a vitreous carbon material produced from a polycarbodiimide resin as a raw material, or from a phenolic resin and a polycarbodiimide resin each as a raw material.

The vitreous carbon material produced from a polycarbodiimide resin or from a phenolic resin and a polycarbodiimide resin, has no or substantially no pores and has a high strength. Therefore, it exhibits excellent properties when used in an electrode plate for plasma etching.

4 Claims, No Drawings

ELECTRODE PLATE AND JIG FOR USE IN PLASMA ETCHING

BACKGROUND OF THE INVENTION (1) Field of the Invention

The present invention relates to an electrode plate and a jig for use in plasma etching, which are used in the plasma etching of a wafer for production of a semiconductor integrated circuit.

(2) Prior Art

With the recent progress of the techniques for production of finer and more dense semiconductor integrated circuit, there has become increasingly important the plasma etching capable of forming a fine pattern on a wafer with high precision using parallel plate electrodes.

The material for the electrodes used in said plasma etching must have electrical conductivity, chemical stability, etc. As the material, there has been tried, for example, graphite. This graphite material is produced by mixing a coke or carbon powder with a binder (e.g., tar or pitch), molding the mixture and firing the molded material to graphitize it. Therefore, the material is difficult to produce so as to have a dense and homogeneous composition and, when fitted in a plasma etching apparatus as an electrode plate to conduct the plasma etching of a wafer, detaching of carbon particles from the electrode plate, occurs which accelerates the consumption of the electrode plate or stains the wafer (this hinders pattern formation).

Under such a situation, it is under investigation to use a vitreous carbon which has an isotropic composition and a high hardness, as an electrode plate for plasma etching. The vitreous carbon whose use as an electrode plate for plasma etching is currently being investigated, includes, for example, those produced as follows.

Japanese Patent Application Kokai (Laid-Open) No. 252942/1987 discloses an electrode plate for use in plasma etching comprising a high-purity vitreous carbon. According to the document, the vitreous carbon is produced by curing, in a plate form, a liquid furan resin, a phenolic resin, a mixture thereof, or a mixture of one of said liquid resins with a powder of same type curable resin and then firing the cured plate in an inert gas. According to the document, an example of such a vitreous carbon has a bulk density of 1.45 $g/cm^3$, a porosity of 3%, a Shore hardness of 75, a bending strength of 580 $kgf/cm^2$ and an elastic modulus of 2,430 $kgf/cm^2$.

In the vitreous carbon produced by the above process, however, the pores formed during the molding step remain in the final product, or the volatile components are evaporated during the heat treatment step and thereby a large number of pores of large diameters (e.g., about 2 mm) are generated, as mentioned in Japanese Patent Application Kokai (Laid-Open) No. 285086/1991.

Also, Japanese Patent Application Kokai (Laid-Open) No. 285086/4991 discloses a vitreous carbon which is produced by basically the same process as in the above-mentioned Japanese Patent Application Kokai (Laid-Open) No. 252942/1987, that is, by subjecting a thermosetting resin (e.g., modified furan resin) to defoaming, curing the defoamed resin in a plate form and then firing the cured plate in an inert gas. This vitreous carbon as well has a porosity of 0.02–0.2%.

The above document makes no mention of properties other than porosity. However, the above vitreous carbon is presumed to have about the same properties as the vitreous carbon of the Japanese Patent Application Kokai (Laid-Open) No. 252942/1987 because it is produced using basically the same raw material and process as in the Japanese Patent Application Kokai (Laid-Open) No. 252942/1987.

Thus, in the conventional processes for production of vitreous carbon, water is generated by the dehydration reaction taking place in the curing step because a phenolic resin or a furan resin is used as a raw material; therefore, the formation of pores in the firing step for cured resin is inevitable. These pores, when the resulting vitreous carbon is used as an electrode plate for plasma etching, bring about an increase in specific surface area and reduction in oxidation resistance and strength.

Further in the vitreous carbons produced by the conventional processes, insufficient strength of the cured resin per se and the pores generated in the dehydration step pose a restriction in mechanical properties of said vitreous carbons.

SUMMARY OF THE INVENTION

The present invention has been made in view of the problems of the conventional techniques and is intended to provide an electrode plate and a jig both enabling high-precision etching and having excellent durability.

According to the present invention, there is provided an electrode plate for use in plasma etching, which comprises a vitreous carbon material produced from a polycarbodiimide resin as a raw material.

According to the present invention, there is further provided an electrode plate for use in plasma etching, which comprises a vitreous carbon material produced from a mixture of a phenolic resin and a polycarbodiimide resin each as a raw material.

The present inventors made study on a vitreous carbon material which can be used as an electrode plate for plasma etching, by paying attention to a polycarbodiimide resin which gives rise to an addition reaction during the curing step and which has an excellent strength after the firing step. As a result, the present inventors found that a vitreous carbon material obtained by firing a polycarbodiimide resin has no pores and sufficiently satisfies the properties required for the electrode plate used in plasma etching. The finding has led to the completion of the present invention.

The present inventors made further study on a vitreous carbon material which can be used as an electrode plate for plasma etching, by paying attention to the fact that while the curing and firing of a phenolic resin alone gives a vitreous carbon having a large number of pores because water is generated by a dehydration reaction during the curing step and this water forms pores during the firing, the curing of a mixture of said phenolic resin and a polycarbodiimide resin suppresses said dehydration reaction and gives a homogeneous cured product. As a result, the present inventors found that a vitreous carbon material obtained by curing and firing a mixture of a phenolic resin and a polycarbodiimide resin has no pores, possesses excellent mechanical properties, and sufficiently satisfies the properties required for the electrode plate used in plasma etching. The finding has led to the completion of the present invention.

DETAILED DESCRIPTION OF THE INVENTION

The polycarbodiimide resin used in the present invention can be produced by, for example, a process disclosed in Japanese Patent Publication Kokai (Laid-Open) No. 61599/1976 or a process disclosed in Japanese Patent Publication Kokai (Laid-Open) No. 292316/1990. It can be easily produced by, for example, a condensation reaction of an organic diisocyanate wherein carbon dioxide removal takes place.

The organic diisocyanate used in the production of the polycarbodiimide resin may be any of aliphatic type, alicyclic type, aromatic type, aralkyl type, etc. They may be used alone or in admixture (in this case, the resulting polycarbodiimide resin is a copolymer).

The organic diisocyanate can be exemplified by 2,4-tolylene diisocyanate, 2,6-tolylene diisocyanate, a mixture thereof, crude tolylene diisocyanate, xylene diisocyanate, m-phenyl diisocyanate, naphthylene-1,5-diisocyanate, 4,4'-biphenylene diisocyanate, 3,3'-dimethoxy-4,4'-biphenyl diisocyanate, and mixtures thereof.

Hence, the polycarbodiimide resin used in the present invention includes homopolymers or copolymers comprising at least one recurring unit represented by -R-N=C=N- (wherein R is an organic diisocyanate residue).

The organic diisocyanate residue which is an organic diisocyanate molecule minus two NCO groups, is preferably an aromatic diisocyanate residue.

The polycarbodiimide resin may have a small molecular weight by stopping the polycondensation reaction of an organic diisocyanate as a raw material in the middle using at least one monoisocyanate. Such a monoisocyanate used for blocking the terminals of a polycarbodiimide to control the molecular weight, can be exemplified by phenyl isocyanate, o-, m- or p-tolyl isocyanate, dimethylphenyl isocyanate, cyclohexyl isocyanate and methyl isocyanate.

The polycarbodiimide resin is cured in a plate form and then carbonized preferably in an inert gas at a temperature of, for example, 1,000° C. or above to obtain a vitreous carbon material (1) of the present invention.

The molding method, curing time and firing time used in production of the polycarbodiimide resin can be selected appropriately. However, the curing and firing are preferably conducted gradually.

The thus obtained vitreous carbon material (1) has no or substantially no pore and its porosity is therefore 0–0.02%. Owing to this very low porosity and the high strength of the cured polycarbodiimide resin itself, the vitreous carbon material of the present invention has, for example, a bending strength of 1,300–1,900 kgf/cm$^2$ and a bulk density of 1.53–1.55 g/cm$^3$.

The phenolic resin used in the present invention can be any as long as it is a generally known phenolic resin. However, a liquid resole type phenolic resin is preferred.

In producing the vitreous carbon material (2) of the present invention, the above phenolic resin is mixed with the above polycarbodiimide resin; the mixture is cured in a plate form; and the cured plate is fired preferably in an inert gas at a temperature of, for example, 1,000° C. or above.

In producing the vitreous carbon material (2), it is preferable that 100 parts by weight of the phenolic resin be mixed with 10–100 parts by weight of the polycarbodiimide resin. When the amount of the polycarbodiimide resin is less than 10 parts by weight per 100 parts by weight of the phenolic resin, it is difficult to control the dehydration reaction of the phenol; as a result, the resulting vitreous carbon has a large number of pores and, when used as an electrode for plasma etching, has a low strength and a reduced life. When the amount of the polycarbodiimide resin is more than 100 parts by weight, phase separation takes place; as a result, the vitreous carbon is non homogeneous and, when used as an electrode for plasma etching, has a low strength and a reduced life.

The molding method, curing time and firing time used in production of the polycarbodiimide-phenol resin can be selected appropriately. However, the curing and firing are preferably conducted gradually.

The thus obtained vitreous carbon material (2) has no or substantially no pore and its porosity is therefore 0–0.02%. The vitreous carbon material of the present invention has, for example, a bending strength of 1,800–2,500 kgf/cm$^2$ and a bulk density of 1.53–1.57 g/cm$^3$ and has excellent mechanical properties.

The vitreous carbon materials (1) and (2), when each used as an electrode plate for plasma etching, must have an impurity content not higher than 5 ppm. Each of these materials can be used widely not only as an electrode plate for plasma etching but also as a jig for plasma etching.

The present invention is hereinafter described in more detail by way of Examples.

EXAMPLE 1

54 g of a 2,4-tolylene diisocyanate (80)/2,6-tolylene diisocyanate (20) mixture (TDI) was subjected to a reaction in the presence of 0.12 g of a carbodiimidization catalyst (1-phenyl-3-methylphospholene oxide) in 500 ml of tetrachloroethylene at 120° C. for 5 hours to obtain a polycarbodiimide solution. The reaction mixture was poured on a glass dish and dried at 60° C. for 20 hours and then at 120° C. for 20 hours. The dried product was heated to 200° C. at a rate of 1° C./hr to obtain a cured plate. The cured plate was heated to 1,000° C. at a rate of 2° C./hr to obtain a vitreous carbon plate (1).

In this plate of 3 mm in thickness was formed through-holes of 0.5 mm in diameter at intervals of 2 mm by electric discharge. Then, a halogen gas was passed through the through-holes at 2,300° C. to purify the plate (1).

The resulting vitreous carbon plate (1) was fitted to an etching apparatus as an electrode plate. A mixed gas consisting of $CF_4$, Ar and $O_2$ was passed through the apparatus to generate a plasma to etch a silicon wafer. The time when the initial thickness of 3 mm was decreased to a residual thickness of 0.5 mm, was taken as the life of the electrode plate. The properties and life of the present electrode plate for use in plasma etching are shown in Table 1.

EXAMPLE 2

50 g of methylenediphenyl diisocyanate (MDI) was subjected to a reaction in the presence of 0.13 g of a carbodiimidization catalyst (1-phenyl-3-methylphospholene oxide) in 880 ml of tetrahydrofuran at 68° C. for 12 hours to obtain a polycarbodiimide solution.

333 parts by weight of the polycarbodiimide solution (solid content of polycarbodiimide resin=20 parts by weight) was added to 100 parts by weight of a phenolic resin [BRL-274 (trade name) manufactured by Showa Highpolymer Co., Ltd., a resole type phenolic resin]. The mixture was stirred at 45° C. for 2 hours, then placed on a glass dish and dried at 45° C. for 20 hours and at 60° C. for 5 hours, and heated to 200° C. at a rate of 1° C./hr to obtain a cured plate. The cured plate was heated to 1,000° C. at a rate of 2° C./hr to obtain a vitreous carbon plate (2).

In this plate of 3 mm in thickness was formed through-holes of 0.5 mm in diameter at intervals of 2 mm by electric discharge. Then, a halogen gas was passed through the through-holes at 2,300° C. to purify the plate (2).

The resulting vitreous carbon plate (2) was fitted to an etching apparatus as an electrode plate. A mixed gas consisting of CF$_4$, Ar and O$_2$ was passed through the apparatus to generate a plasma to etch a silicon wafer. The time when the initial thickness of 3 mm was decreased to a residual thickness of 0.5 mm, was taken as the life of the electrode plate. The properties and life of the present electrode plate for use in plasma etching are shown in Table 1.

EXAMPLE 3

830 parts by weight of a polycarbodiimide solution (solid content of polycarbodiimide resin=50 parts by weight) prepared in the same manner as in Example 2 was added to 100 parts by weight of the same phenolic resin as used in Example 2. Using this mixture, an electrode plate for use in plasma etching was obtained in the same manner as in Example 2. The plate was tested in the same manner as in Example 2. The results are shown in Table 1.

EXAMPLE 4

1,500 parts by weight of a polycarbodiimide solution (solid content of polycarbodiimide resin=90 parts by weight) prepared in the same manner as in Example 2 was added to 100 parts by weight of the same phenolic resin as used in Example 2. Using this mixture, an electrode plate for use in plasma etching was obtained in the same manner as in Example 2. The plate was tested in the same manner as in Example 2. The results are shown in Table 1.

COMPARATIVE EXAMPLE 1

Using the same phenolic resin as used in Example 2, an electrode plate for use in plasma etching was obtained in the same manner as in Example 2. The plate was tested in the same manner as in Example 2. The results are shown in Table 1.

COMPARATIVE EXAMPLE 2

0.4 part by weight of p-toluenesulfonic acid was mixed with furfuryl alcohol. The mixture was polymerized and subjected to defoaming. The reaction mixture was placed on a glass dish and subjected to the same procedure as in Example 1 to obtain a vitreous carbon plate. The plate was tested in the same manner as in Example 1. The results are shown in Table 1.

COMPARATIVE EXAMPLE 3

0.4 part by weight of p-toluenesulfonic acid was mixed with furfuryl alcohol. The mixture was polymerized and subjected to defoaming. The reaction mixture was placed on a glass dish and heated to 200° C. at a rate of 1° C./hr for curing. The cured product was ground to obtain a powder of 30–70 μm in particle diameter. The powder was mixed with a furan resin of similar type. The resulting mixture was subjected to the same procedure as in Example 1 to obtain a vitreous carbon plate. The plate was tested in the same manner as in Example 1. The results are shown in Table 1.

COMPARATIVE EXAMPLE 4

3,330 parts by weight of a polycarbodiimide solution (solid content of polycarbodiimide resin=200 parts by weight) prepared in the same manner as in Example 2 was added to 100 parts by weight of the same phenolic resin as used in Example 2. Using this mixture, an electrode plate for use in plasma etching was obtained in the same manner as in Example 2. The plate was tested in the same manner as in Example 2. The results are shown in Table 1.

TABLE 1

|  | Bending strength, kgf/cm$^2$ | Shore hardness | Porosity % | Density g/cm$^3$ | Life hr |
|---|---|---|---|---|---|
| Example 1 | 1,800 | 130 | 0 | 1.54 | 824 |
| Example 2 | 1,800 | 120 | 0 | 1.54 | 850 |
| Example 3 | 2,400 | 120 | 0 | 1.55 | 900 |
| Example 4 | 1,900 | 125 | 0 | 1.55 | 850 |
| Comparative Example 1 | 850 | 75 | 3 | 1.45 | 310 |
| Comparative Example 2 | 1,000 | 110 | 0.2 | 1.48 | 490 |
| Comparative Example 3 | 500 | 90 | 5 | 1.40 | 195 |
| Comparative Example 4 | 1,000 | 105 | 0.3 | 1.50 | 450 |

As described above, the present electrode plate for use in plasma etching enables high-precision etching and has excellent mechanical properties and durability.

What is claimed is:

1. An electrode plate for use in plasma etching, which comprises a vitreous carbon material produced from a polycarbodiimide resin as a raw material, wherein the vitreous carbon material is produced by molding, curing and carbonizing the polycarbodiimide resin, wherein carbonization is performed using a temperature elevation of 2° C./hour or less, and wherein said electrode plate has a porosity of 0%.

2. An electrode plate for use in plasma etching according to claim 1, wherein the vitreous carbon material has a bending strength of 1,300–1,900 kgf/cm$^2$ and a bulk density of 1.53–1.55 g/cm$^3$.

3. An electrode plate for use in plasma etching, which comprises a vitreous carbon material produced from a phenolic resin and a polycarbodiimide resin each as a raw material, wherein the vitreous carbon material is produced by mixing the phenolic resin and the polycarbodiimide resin to produce a mixed resin, and molding, curing and carbonizing said mixed resin, wherein said carbonization is performed using a temperature elevation of 2° C./hour or less, wherein said electrode plate has a porosity of 0%, and wherein the vitreous carbon material is produced from a raw material which is a mixture of 100 parts by weight of a phenolic resin and 10–100 parts by weight of a polycarbodiimide resin.

4. An electrode plate for use in plasma etching according to claim 3, wherein the vitreous carbon material has a bending strength of 1,800–2,500 kgf/cm$^2$ and a bulk density of 1.53–1.57 g/cm$^3$.

\* \* \* \* \*